United States Patent [19]

Aitken et al.

[11] Patent Number: 5,268,324
[45] Date of Patent: Dec. 7, 1993

[54] MODIFIED SILICON CMOS PROCESS HAVING SELECTIVELY DEPOSITED SI/SIGE FETS

[75] Inventors: John M. Aitken, Mahopac, N.Y.; Vijay P. Kesan, Ridgefield, Conn.; Seshadri Subbanna, Hopewell Junction, N.Y.; Manu J. Tejwani, Yorktown Heights, N.Y.; Subramanian S. Iyer, Yorktown Heights, N.Y.

[73] Assignee: International Business Machines Corporation, Armonk, N.Y.

[21] Appl. No.: 890,042

[22] Filed: May 27, 1992

[51] Int. Cl.$^5$ .................................. H01L 21/70
[52] U.S. Cl. ........................... 437/57; 437/34; 437/131; 437/45; 148/DIG. 82
[58] Field of Search ............... 437/57, 131, 126, 34, 437/913, 915, 132, 89, 45; 148/DIG. 72, DIG. 59, DIG. 15, DIG. 82

[56] References Cited

U.S. PATENT DOCUMENTS

| | | | |
|---|---|---|---|
| 4,027,380 | 6/1977 | Deal et al. | 29/571 |
| 4,760,033 | 7/1988 | Mueller | 437/34 |
| 4,861,393 | 8/1989 | Bean et al. | 148/33.4 |
| 4,975,387 | 12/1990 | Prokes et al. | 437/131 |
| 4,994,866 | 2/1991 | Awano | 357/16 |
| 5,019,882 | 5/1991 | Solomon et al. | 357/23.8 |
| 5,036,374 | 7/1991 | Shimbo | 437/132 |

FOREIGN PATENT DOCUMENTS 0122177 5/1988 Japan .................... 437/34

OTHER PUBLICATIONS

S. C. Martin, et al., "p-Channel Germanium MOSFET's With High Channel Mobility" IEEE Electron Device Letters, vol. 10, No. 7, pp. 325–326, Jul. 1989.
S. S. Iyer, et al., "A Gate-Quality Dielectri System for SiGe Metal-Oxide-Semiconductor Devices" IEEE Electron Device Letters, vol. 12, No. 5, pp. 246–248 May 1991.
S. S. Iyer, et al., "Si-SiGe Metal Oxide Semiconductor Devices" Abstract Only of Reference AS, IEEE Electron Device Letters, vol. 12, No. 5, May 1991.
S. Subbanna, et al., "Si/SiGe p-Channel MOSFETs" 1991 Symposium on VLSI Technology Digest of Technical Papers, pp. 103–104 (May 1991).
V. P. Kesan, et al., "High Performance 0.25 um p-MOSFETs with Silicon-Germanium Channels for 300K and 77K Operation" International Electron Devices Meeting, Washington, D.C. pp. 25–25 (Dec. 1991).

Primary Examiner—Brian E. Hearn
Assistant Examiner—Tuan Nguyen
Attorney, Agent, or Firm—Harold Huberfeld

[57] ABSTRACT

A process is disclosed for making CMOS devices with enhanced performance PMOS FETS by integrating germanium technology into a silicon-based fabrication method. Silicon-germanium layers are selectively grown on the surfaces of oxide-isolated PFET pockets of a silicon substrate previously prepared by a conventional silicon CMOS process. A silicon cap is deposited over each Si—Ge layer and gate insulator is formed over the cap provide gate dielectric for the PFETS. Gate insulator is formed over the NFET pockets to provide gate dielectric for the NFETS. Gate structures are completed along with source and drain junctions in accordance with normal practice. Provision also is made for the additional selective growth of a second silicon-germanium layer on the surfaces of oxide-isolated NFET pockets on the same CMOS substrate to enhance the performance of the NFETS as well as that of the PFETS.

8 Claims, 4 Drawing Sheets

MODIFIED SILICON CMOS PROCESS HAVING SELECTIVELY DEPOSITED SI/SIGE FETS

BACKGROUND OF THE INVENTION

The invention generally relates to silicon (Si) CMOS transistor technology and, more particularly to silicon-germanium-based techniques for modifying the Si technology to enhance the performance of the CMOS transistors, particularly the p-channel transistors.

U.S. Pat. No. 4,994,866, issued to Yuji Awano on Feb. 19, 1991 notes the prior art teachings that silicon is usually employed as the material for CMOS devices and that the switching speed of the silicon PMOSFET is slower than that of the silicon NMOSFET. Thus, the switching speed of the CMOS circuit as a whole is limited by that of the PMOSFET.

In order to increase the switching speed of the PMOS toward the level of that of the NMOS, it is proposed in the cited patent that increased hole mobility for the PMOS may be provided by growing on a silicon substrate, in sequence, a first layer of silicon-germanium (Si—Ge), a layer of Ge, a second layer of Si—Ge and a top layer of Si. Portions of the substrate containing PMOSFETS and NMOSFETS are isolated from each other by grooves extending from the top layer to the substrate. The channel layer of the PMOSFET comprises the aforementioned Ge layer. The channel layer of the NMOSFET comprises the aforementioned top Si layer.

Although the above described patent teaching is aimed at making the switching speed of the CMOS device limited by the Nchannel (Si) device of the proposed Si/Si—Ge CMOS, rather than by the Pchannel (Si) of the earlier-art all—Si CMOS, the described Si—Ge CMOS process does not use oxide isolation to isolate PMOS from NMOSFETS and otherwise does not bear close resemblance to preexisting, well-developed production CMOS processes.

SUMMARY OF THE INVENTION

One object of the present invention is to provide a CMOS device with an enhanced speed PMOSFET made with easily managed modifications added to an established silicon CMOS production process flow.

Another object is to provide a CMOS device in which overall switching speed is limited by the NMOSFET.

A further object is to provide a CMOS device formed on a silicon substrate in which the switching speeds of both the PMOS and NMOSFETS are enhanced through the integration of germanium technology.

These and other objects of the present invention, as will appear from a reading of the following specification, are achieved in a first embodiment, through modification of a conventional silicon CMOS process to include the selective growth of a Si—Ge channel layer on the surfaces of oxide-isolated PFET pockets of a silicon substrate previously prepared by a conventional silicon CMOS process. A Si cap is deposited over each channel layer and the cap is oxidized to provide gate oxide for the PFETs. Simultaneously, oxide is grown over the NFET pockets to provide gate oxide for the NFETS. P-doped polysilicon is deposited and all the gate areas are defined as in conventional CMOS processes. After gate definition, source and drain junctions and contacts are formed to complete the CMOS devices. The first embodiment of the present invention is further described in a paper published by the present inventors in 1991 and cited in the following specification.

A second embodiment provides not only for the performance enhancement of the PFETS but also for the NFETS by the additional selective growth of a Si—Ge layer and Si cap on the surfaces of oxide-isolated N FET pockets of the substrate. The Si—Ge layers for the PFETS and the SI—GE layers for the NFETS are grown separately for independent Si—Ge channel design. Provision also can be made for separate threshold voltage control for the PFETS and NFETS.

BEST MODE FOR CARRYING OUT THE INVENTION

CMOS processes for silicon-based PFETS and NFETS are long established in the art. One example of such a process is described in U.S. Pat. No. 4,027,380, issued to Bruce E. Deal et al on Jun. 7, 1977. As is well understood, when such CMOS devices are exercised at high switching rates, the maximum attainable speed is limited by that of the P-channel FET because hole mobility in silicon is much slower than electron mobility. Consequently, the art has proposed techniques to enhance the P-channel FET switching speed preferably without resort to simply increasing the size of the PFETS (and thereby sacrificing device density) in order to stay entirely in the realm of silicon.

Accordingly, there have been proposals to incorporate germanium PFETS into the surface of silicon substrates as in the case of the previously cited U.S. Pat. No. 4,994,866. As already noted, the patent teaches forming special layers across the entire upper surface of the silicon substrate, not only where PFETS are to be formed, but also where NFETS are to be formed. Thus, there is no independent manner to tailor the channels of the PFETS and NFETS or to separately control the $V_T$ of the two FET types. Additionally, the '866 patent teaches the inclusion of seldom used mesa isolation wherein a groove extends from the top surface of the CMOS devices into the silicon substrate to separate electrically the PFETS and the NFETS from each other.

Figure 1A:
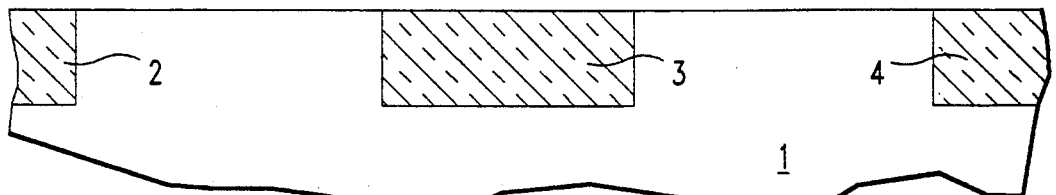
FIGS. 1A-1F are simplified cross-sectional views of a first embodiment of the process of the present invention at selected successive times during the fabrication of a CMOS device having enhanced performance PFETS.
Figure 1B:
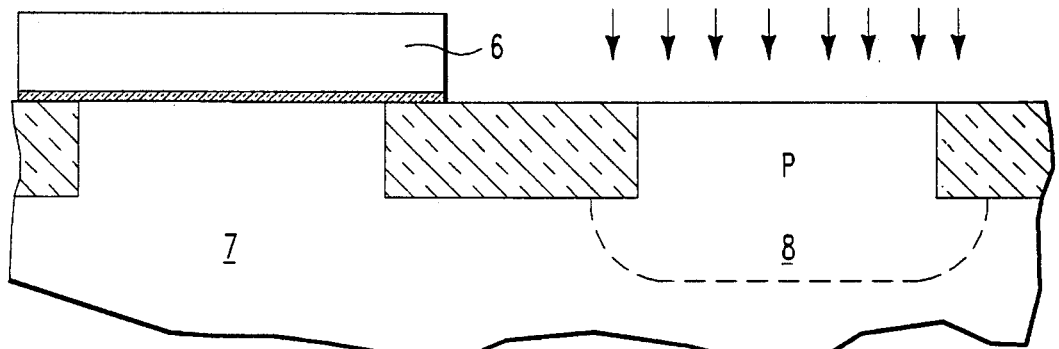

The present invention, on the other hand, provides for FET performance enhancement without radical departure from existing silicon CMOS processing. Referring to FIG. 1A, and with background reference to the previously cited silicon CMOS process U.S. Pat. No. 4,027,380, a silicon substrate is provided with recessed oxide isolation areas 2, 3 and 4. A screen oxide 5 is deposited (FIG. 1B) and a resist mask 6 is placed over the N-well area 7. A P-well implant is made into area 8.

Figure 1C:
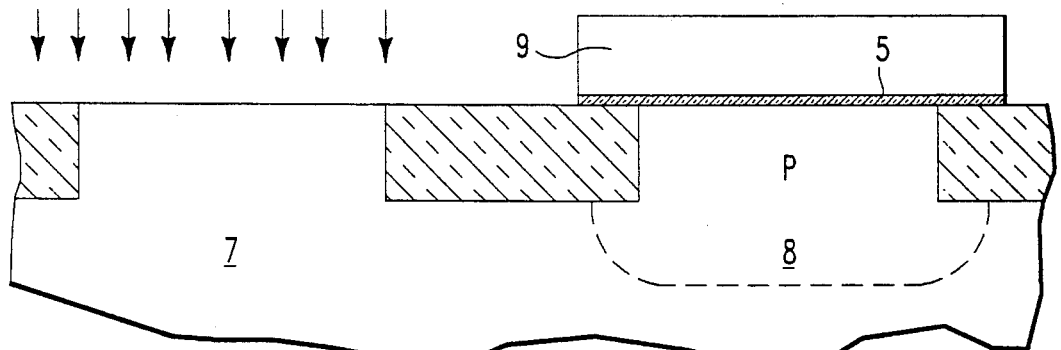
Figure 1D:
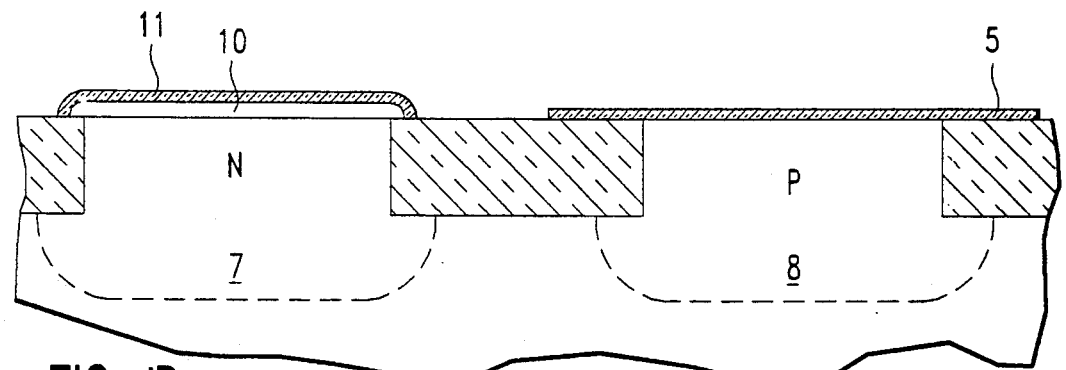

Similarly, a resist mask 9 is placed over the P-well area and an N-well implant is made into area 7 (FIG. 1C), all in accordance with known silicon CMOS practice. The screen oxide 5 is then removed over the N-well area 7 and PFET channel material is deposited by UHV-CVD comprising a layer 10 of $Si_{1-x}Ge_x$ ($0 \leq x \leq 0.25$) of thickness in the range 125 Å to 300 Å and a capping layer 11 of 70 Å to 105 Å Si (FIG. 1D). The Si/SiGe overgrows the field oxide epitaxially without facetting, thus avoiding leakage at the point where the gate polysilicon (to be added) crosses over onto the field oxide. Further details are given in the paper "High Performance 0.25 μm P-MOSFETS With Silicon-Germanium Channels for 300K and 77K Operation" by V. P. Kesan et al Technical Digest, 1991 International Electron Device Meeting, pp. 25-28 (1991), previously alluded to.

The remaining steps are again similar to established silicon CMOS processing. A dilute hydrofluoric acid (DHF) dip removes the screen oxide 5 remaining over the P-well and gate oxide 12 is grown or insulator is deposited. Doped polysilicon gates 13, 14 are deposited on the gate oxide. After gate definition, source-drain junctions 15-18 are formed and self-aligned titanium silicide 19-22 is added after insulator sidewalls (such as oxide-nitride sidewalls) 23-26 are placed about polysilicon gates 13 and 14. Conventional Ti/Al metallization (not shown) completes the devices.

It should be noted that a silicon Nchannel device is produced in P-well 8 while a Si/SiGe Pchannel device is produced in N-well 7. If it is also desired to enhance the performance of the Nchannel device by exploiting the higher electron mobility in germanium relative to silicon, the present invention is readily adapted thereto as will now be explained with the aid of FIGS. 2A-2E representing the second embodiment. For the sake of avoiding unnecessary duplication, it will be understood that process steps equivalent to those discussed in connection with FIGS. 1A-1C of the first embodiment preceded FIG. 2A of the second embodiment.

Figure 2A:
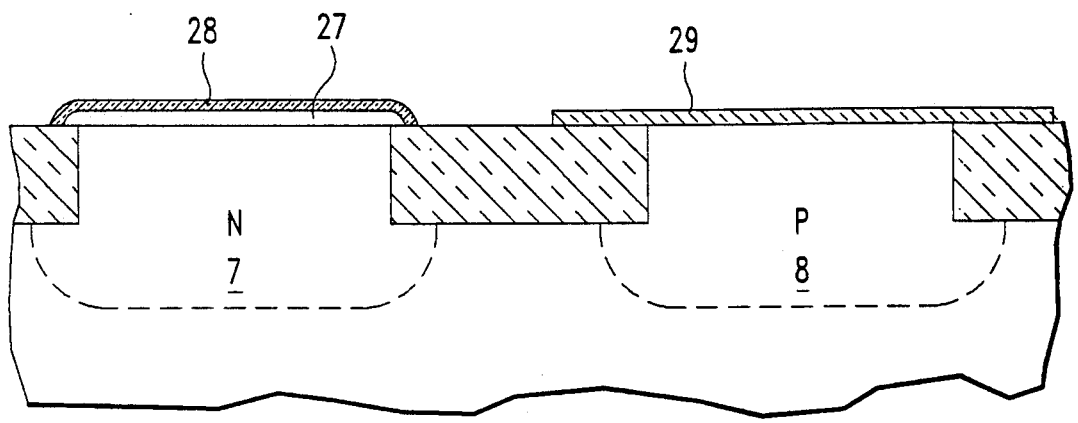
FIGS. 2A-2E are simplified cross-sectional views of a second embodiment of the process of the present invention at selected successive times during the fabrication of a CMOS device having enhanced performance PFETS and NFETS.
Figure 2B:
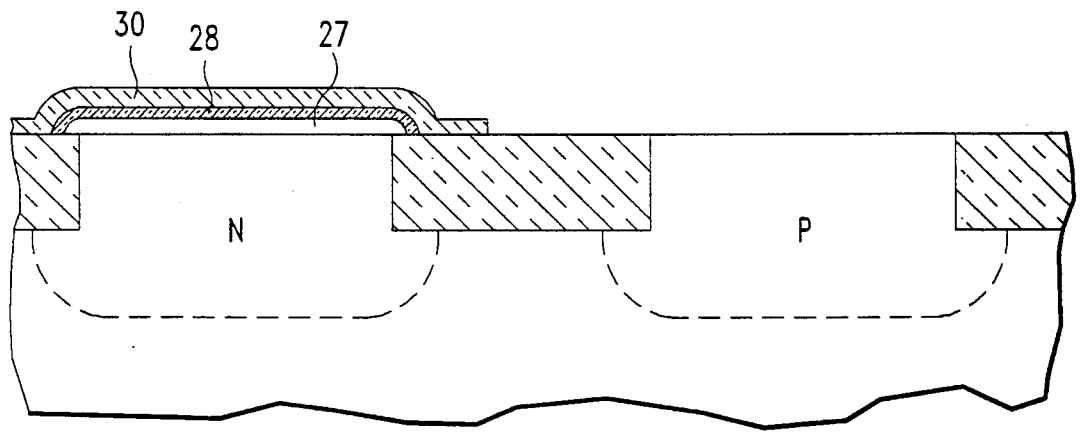
Figure 2C:
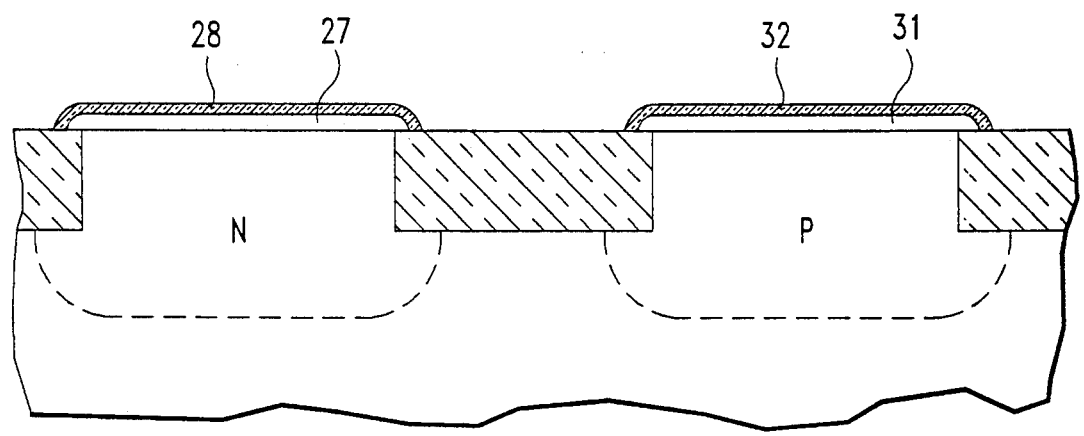

Referring now to FIG. 2A (which corresponds to FIG. 1D of the first embodiment), PFET channel material 27 is deposited by UHV-CVD comprising a layer of $Si_xGe_{1-x}$ and a capping layer 28 of Si with screen oxide 29 in place over the P-well. Then, a layer of CVD oxide 30 is deposited on the PFET material 28 and the screen oxide 29 on the surface of the P-well is etched away with the use of an additional mask as shown in FIG. 2B. A second Si/SiGe channel deposit 31, 32 is selectively made on the surface of the P-well for a Si/SiGe NFET and the CVD oxide layer 30 is etched away (FIG. 2C).

Figure 1E:
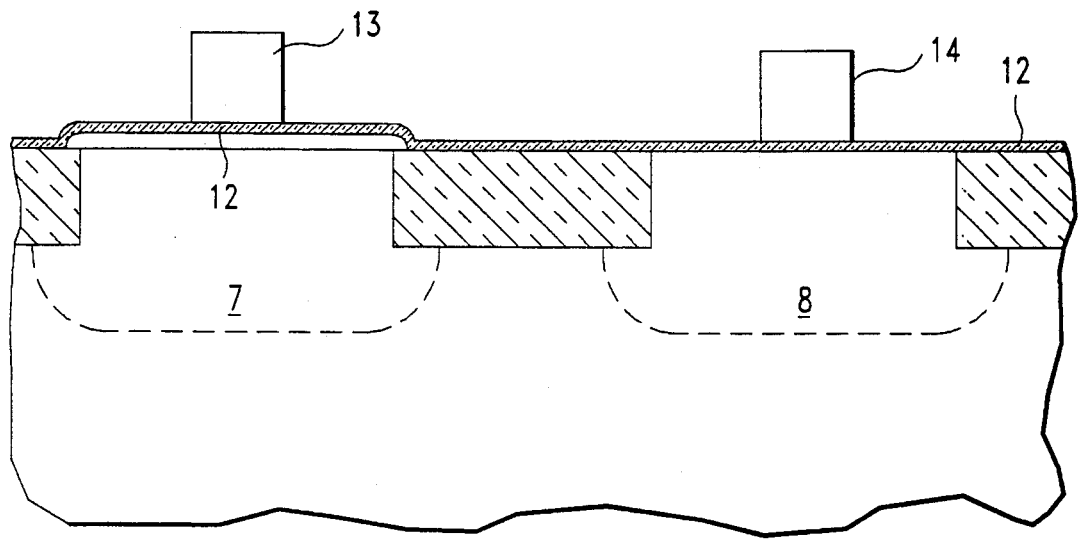
Figure 1F:
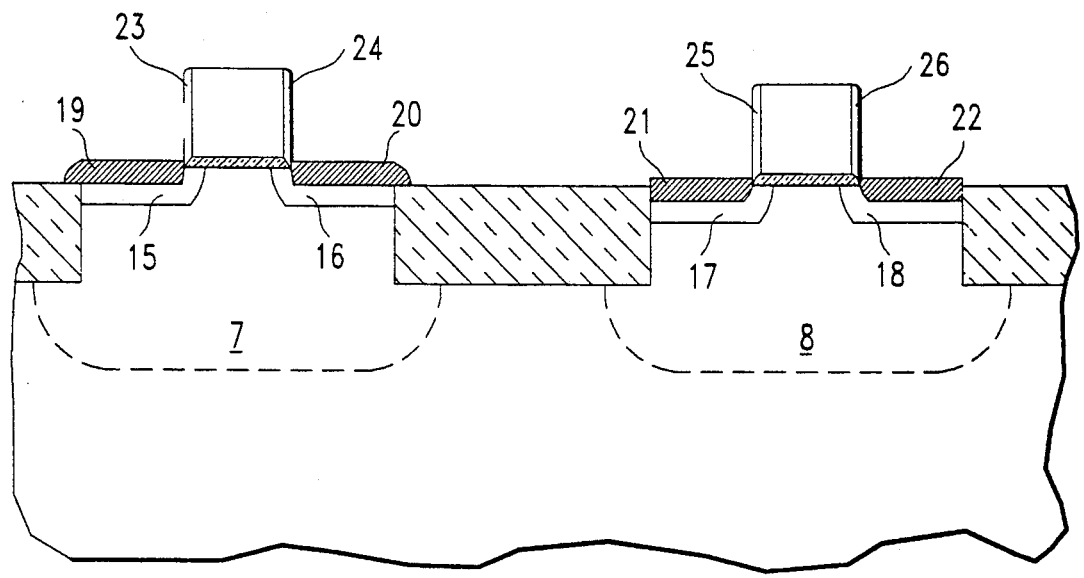
Figure 2D:
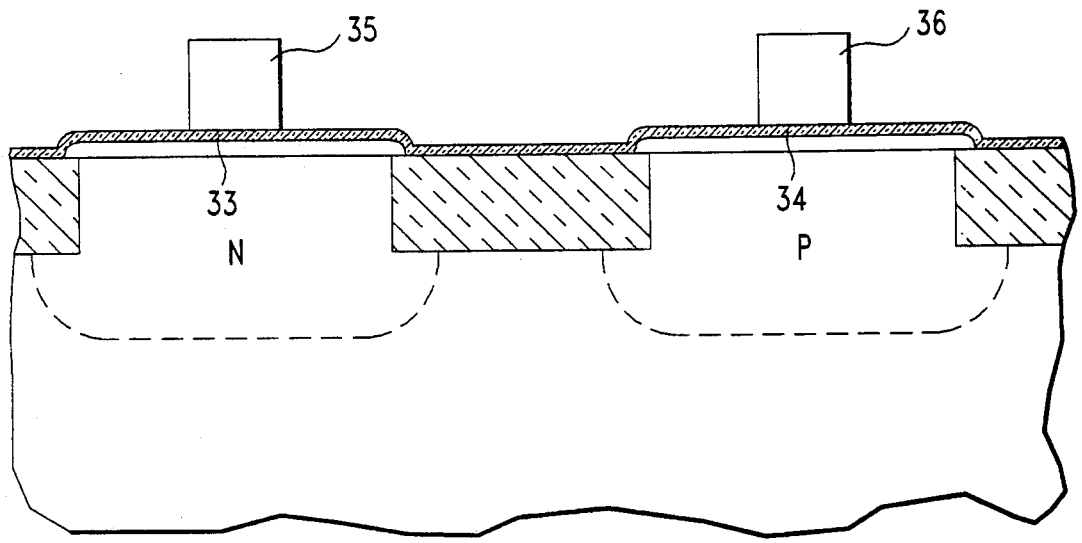
Figure 2E:
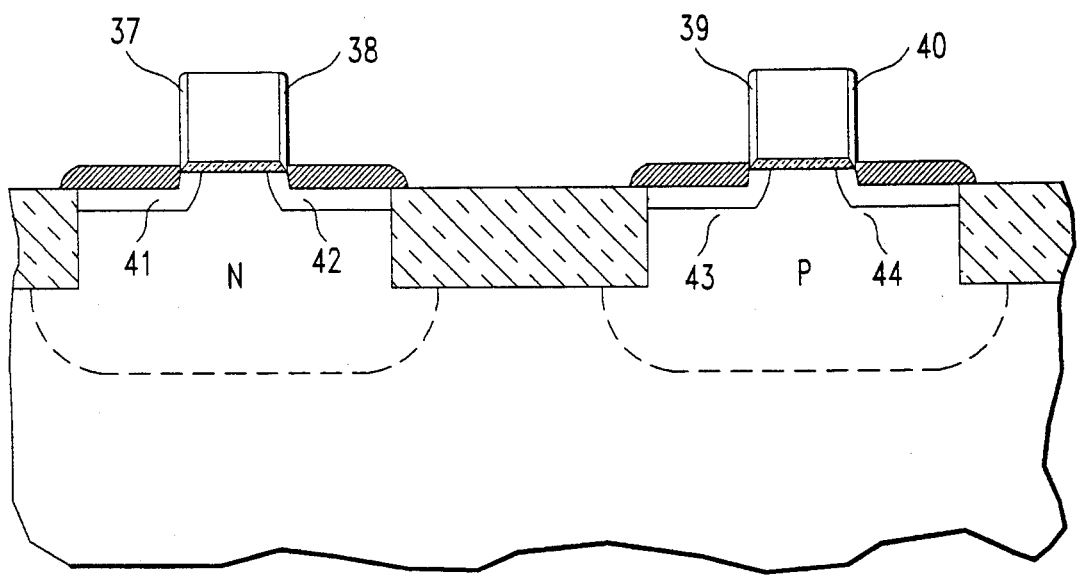

The remaining steps correspond to the steps of the first embodiment discussed in connection with FIGS. 1E and 1F. Briefly, the top silicon layers 28 and 32 of FIG. 2C are oxidized to produce the CMOS gate dielectrics 33 and 34, gate polysilicon 35 and 36 are deposited on the gate dielectrics (FIG. 2D). Insulator sidewalls (such as oxide-nitride sidewalls) 37 and 38 are placed about polysilicon gate 35 while oxide-nitride sidewalls 39 and 40 are placed about polysilicon gate 36. Source-drain junctions 41-44 are formed and self-aligned titanium silicide 41-44 is added (FIG. 2E). Conventional Ti/Al metallization (not shown) completes the devices.

As stated earlier, the overall performance of an all-silicon CMOS switching device is limited by the slower PFET. The first embodiment of the present invention, by substituting a Si/SiGe PFET for the silicon PFET, boosts the PFET performance to exceed that of the NFET whereby the CMOS switching limit is raised to that of the silicon NFET. A further substantial increase in CMOS speed is attained with the aid of the second embodiment of the present invention whereby both the silicon NFETS and silicon PFETS are replaced by Si/SiGe NFETS and PFETS. Both of the latter are much faster than their silicon counterparts.

The present invention, in both of its embodiments, achieves the foregoing important improvements in at least PMOS performance without resort to complex changes to preexisting silicon CMOS processes or to new and radically different processes. One of the principal aspects of the invention, as discussed above, is its ready integration with well known and long-mastered silicon CMOS processing.

While there have been described what are at present considered to be the preferred embodiments of the present invention, it will be obvious to those skilled in the art that various changes or modifications may be made therein, without departing from the invention, and it is, therefore, aimed in the appended claims to cover all those changes and modifications as follow in the true spirit and scope of the invention.

What is claimed is:

1. A process for making CMOS devices comprising: forming recessed oxide-isolated regions of a silicon substrate for PFETS and NFETS, respectively,
   said regions being oppositely doped relative to each other to accommodate said PFETS and NFETS, respectively,
   selectively depositing only on the surface of each of said regions associated with said PFETS a channel layer comprising a silicon-germanium layer covered by a silicon capping layer,
   forming a dielectric on said capping layer and over each of said regions associated with said NFETS,
   forming a conductive gate member over said oxide in each of said regions to complete the gate structures of said PFETS and NFETS, and
   forming source and drain regions adjacent each of said gate members.

2. The process defined in claim 1 wherein said dielectric is formed by simultaneously oxidizing said capping layer and the silicon surface of each of said regions associated with said NFETS.

3. The process defined in claim 1 wherein said silicon-germanium layer composition is within the range defined by $$Si_{1-x}Ge_x \ (0 \leq x \leq 0.25)$$

4. The process defined in claim 3 wherein the thickness of said silicon-germanium layer is within the range of about 125 Å to about 300 Å.

5. A process for making CMOS devices comprising: forming recessed oxide-isolated regions of a silicon substrate for PFETS and NFETS, respectively,
   said regions being oppositely doped relative to each other to accommodate said PFETS and NFETS, respectively,
   selectively depositing on the surface of each of said regions associated with said PFETS a first channel layer comprising a silicon-germanium layer covered by a silicon capping layer,
   subsequently selectively depositing on the surface of each of said regions associated with said NFETS a second channel layer comprising a silicon-germanium layer covered by a silicon capping layer,
   forming a dielectric on said capping layers, forming a conductive gate member over said dielectric in each said region to complete the gate structures of said PFETS and NFETS, and forming source and drain regions adjacent each of said gate members.

6. The process defined in claim 3 wherein said oxide is formed by oxidizing said capping layers.

7. The process defined in claim 5 wherein the composition of said silicon-germanium layer of said first channel layer is within the range defined by $$Si_{1-x}Ge_x\ (0 \leq x \leq 0.25).$$

8. The process defined in claim 7 wherein the thickness of said silicon-germanium layer of said first channel layer is within the range of about 125 Å to about 300 Å.

* * * * *